(12) United States Patent
Zubkov et al.

(10) Patent No.: US 6,572,925 B2
(45) Date of Patent: Jun. 3, 2003

(54) PROCESS FOR FORMING A LOW DIELECTRIC CONSTANT FLUORINE AND CARBON CONTAINING SILICON OXIDE DIELECTRIC MATERIAL

(75) Inventors: Vladimir Zubkov, Mountain View, CA (US); Sheldon Aronowitz, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 153 days.

(21) Appl. No.: 09/792,683

(22) Filed: Feb. 23, 2001

(65) Prior Publication Data

US 2002/0119326 A1 Aug. 29, 2002

(51) Int. Cl.[7] .............................................. C23C 16/40
(52) U.S. Cl. .............................. 427/255.37; 427/249.1; 427/255.393
(58) Field of Search ...................... 427/255.37, 249.15, 427/255.28, 255.39, 255.393, 249.1

(56) References Cited

U.S. PATENT DOCUMENTS

| | | |
|---|---|---|
| 3,012,861 A | 12/1961 | Ling |
| 3,178,392 A | 4/1965 | Kriner |
| 3,652,331 A | 3/1972 | Yamazaki |
| 3,832,202 A | 8/1974 | Ritchie |
| 3,920,865 A | 11/1975 | Läufer et al. |
| 4,705,725 A | 11/1987 | Glajch et al. |
| 4,771,328 A | 9/1988 | Malaviya et al. |
| 5,194,333 A | 3/1993 | Ohnaka et al. |
| 5,314,845 A | 5/1994 | Lee et al. |
| 5,364,800 A | 11/1994 | Joyner |
| 5,376,595 A | 12/1994 | Zupancic et al. |
| 5,470,801 A | 11/1995 | Kapoor et al. |
| 5,558,718 A | 9/1996 | Leung |
| 5,559,367 A | 9/1996 | Cohen et al. |
| 5,580,429 A | 12/1996 | Chan et al. |
| 5,628,871 A | 5/1997 | Shinagawa |
| 5,675,187 A | 10/1997 | Numata et al. |
| 5,688,172 A | 11/1997 | Lorenzo Regidor |
| 5,858,879 A | 1/1999 | Chao et al. |
| 5,864,172 A | 1/1999 | Kapoor et al. |
| 5,874,367 A | 2/1999 | Dobson |
| 5,874,745 A | 2/1999 | Kuo |
| 5,882,489 A | 3/1999 | Bersin et al. |
| 5,904,154 A | 5/1999 | Chien et al. |
| 5,915,203 A | 6/1999 | Sengupta et al. |
| 5,930,655 A | 7/1999 | Cooney, III et al. |
| 5,939,763 A | 8/1999 | Hao et al. |
| 5,989,998 A | 11/1999 | Sugahara et al. |
| 6,025,263 A | 2/2000 | Tsai et al. |
| 6,028,015 A | 2/2000 | Wang et al. |
| 6,037,248 A | 3/2000 | Ahn |
| 6,043,145 A | 3/2000 | Suzuki et al. |
| 6,043,167 A | 3/2000 | Lee et al. |
| 6,051,073 A | 4/2000 | Chu et al. |
| 6,051,477 A | 4/2000 | Nam |
| 6,054,379 A | 4/2000 | Yau et al. |
| 6,063,702 A | 5/2000 | Chung |
| 6,066,574 A | 5/2000 | You et al. |
| 6,114,259 A | 9/2000 | Sukharev et al. |
| 6,147,012 A | 11/2000 | Sukharev et al. |
| 6,153,524 A | 11/2000 | Henley et al. |
| 6,204,192 B1 | 3/2001 | Zhao et al. |
| 6,207,585 B1 * | 3/2001 | Hasegawa et al. .......... 438/763 |
| 6,215,087 B1 | 4/2001 | Akahori et al. |
| 6,232,658 B1 | 5/2001 | Catabay et al. |
| 6,316,354 B1 * | 11/2001 | Hu .............................. 438/652 |
| 6,365,528 B1 * | 4/2002 | Sukharev et al. ........... 438/778 |
| 6,391,795 B1 * | 5/2002 | Catabay et al. ............. 438/763 |

FOREIGN PATENT DOCUMENTS

| | | |
|---|---|---|
| DE | 198 04 375 A1 | 7/1999 |
| EP | 0 706 216 A2 | 4/1996 |
| JP | 0 949 663 A2 | 1/1988 |
| JP | 63003437 | 1/1988 |
| JP | 2000-267128 | 9/2000 |
| WO | WO 99/41423 | 8/1999 |

OTHER PUBLICATIONS

Koda, Seiichiro, et al., "A Study of Inhibition Effects for Silane Combustion by Additive Gases", *Combustion and Flame*, vol. 73, No. 2, Aug. 1988, pp. 187–194.

Bothra, S., et al., "Integration of 0.25 βm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Nguyen, S. et al., "Reaction Mechanisms of Plasma– and Thermal–Assisted Chemical Vapor Deposition of Tetraethylorthosilicate Oxide Films", *J. Electrochem. Soc.*, vol. 137, No. 7, Jul., 1990, pp. 2209–2215.

(List continued on next page.)

*Primary Examiner*—Bret Chen
(74) *Attorney, Agent, or Firm*—John P. Taylor

(57) ABSTRACT

A process is provided for forming a low k fluorine and carbon-containing silicon oxide dielectric material by reacting with an oxidizing agent one or more silanes including one or more organofluoro silanes characterized by the absence of aliphatic C—H bonds. In one embodiment, the process is carried out using a mild oxidizing agent. Also provided is a low dielectric constant fluorine and carbon-containing silicon oxide dielectric material for use in an integrated circuit structure containing silicon atoms bonded to oxygen atoms, silicon atoms bonded to carbon atoms, and carbon atoms bonded to fluorine atoms, where the dielectric material is characterized by the absence of aliphatic C—H bonds and where the dielectric material has a ratio of carbon atoms to silicon atoms of C:Si greater than about 1:3.

21 Claims, 1 Drawing Sheet

OTHER PUBLICATIONS

Peters, Laura, "Low–k Dielectrics: Will Spin–On or CVD Prevail?", *Semiconductor International*, vol. 23, No. 6, Jun., 2000, pp. 108–110, 114, 116,118,122, and 124.

Peters, Laura, "Pursuing the Perfect Low–k Dielectric", *Semiconductor International*, vol. 21, No. 10, Sep., 1998, pp. 64–66, 68, 70, 72, and 74.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

* cited by examiner

```
┌─────────────────────────────────────────────┐
│ PROVIDING A SEMICONDUCTOR SUBSTRATE IN      │
│ A CVD REACTOR ON A SUBSTRATE SUPPORT        │
│ CAPABLE OF MAINTAINING THE SUBSTRATE        │
│ AT A TEMPERATURE NOT EXCEEDING ABOUT        │
│ 25°C DURING FORMATION OF A LOW K FILM       │
│ OF FLUORINE AND CARBON-CONTAINING           │
│ SILICON OXIDE DIELECTRIC MATERIAL           │
└─────────────────────────────────────────────┘
                      │
                      ▼
┌─────────────────────────────────────────────┐
│ INTRODUCING INTO THE CVD REACTOR A          │
│ VAPOROUS SOURCE OF PEROXIDE AND A           │
│ VAPOROUS SILANE HAVING CARBON ATOMS         │
│ AND FLUORINE ATOMS AND CHARACTERIZED        │
│ BY THE ABSENCE OF ALIPHATIC C-H BONDS       │
└─────────────────────────────────────────────┘
                      │
                      ▼
┌─────────────────────────────────────────────┐
│ DEPOSITING ON THE SUBSTRATE IN THE CVD      │
│ REACTOR A LOW K FILM OF FLUORINE AND        │
│ CARBON-CONTAINING SILICON OXIDE             │
│ DIELECTRIC MATERIAL CHARACTERIZED BY        │
│ IMPROVED RESISTANCE TO OXIDATION            │
└─────────────────────────────────────────────┘
```

FIGURE

PROCESS FOR FORMING A LOW DIELECTRIC CONSTANT FLUORINE AND CARBON CONTAINING SILICON OXIDE DIELECTRIC MATERIAL

CROSS REFERENCE TO RELATED APPLICATIONS

The subject matter of this application relates to the subject matter of copending U.S. patent application Ser. No. 09/792,685 entitled "A PROCESS FOR FORMING A LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION", assigned to the assignee of this application, and filed on the same date as this application.

The subject matter of this application relates to the subject matter of copending U.S. patent application Ser. No. 09/792,691 entitled "A PROCESS FOR FORMING A LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION", assigned to the assignee of this application, and filed on the same date as this application.

The subject matter of this application relates to the subject matter of U.S. Pat. No. 6,365,528, issued Apr. 2, 2002, entitled "A LOW TEMPERATURE PROCESS FOR FORMING A LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION AND GOOD GAP-FILLING CAPABILITIES", and assigned to the assignee of this application.

BACKGROUND OF THE INVENTION

1. Field of the Invention

This invention relates to integrated circuit structures. More particularly this invention relates to the low temperature formation of a low dielectric constant (k) fluorine and carbon-containing silicon oxide dielectric material for use in the formation of integrated circuit structures.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

Dobson et al., in an article entitled "Advanced $SiO_2$ Planarization Using Silane and $H_2O_2$", published in Semiconductor International, December 1994, at pages 85–88, describe the low temperature formation of $SiO_2$ by reaction of silane ($SiH_4$) with hydrogen peroxide ($H_2O_2$) to produce a silicon oxide which flows like a liquid and thus exhibits good gap fill characteristics.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Flowfill process.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The incorporation of such carbon-doped silicon oxide dielectric material into interconnect architecture has been very attractive not only because of the low k properties, but also because of the compatibility with conventional silicon process technologies. Generally these materials remain stable upon annealing at temperatures of up to 500° C. The carbon doped silicon oxide materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

While such carbon-doped silicon oxide dielectric materials do exhibit the desired low k (i.e., dielectric constants below about 3.0), resulting in reduced capacitance of the dielectric material, a major problem of such carbon-doped silicon oxide is a low resistance to oxidation that results in a destruction of the incorporated hydrocarbons and a resulting increase in the overall dielectric constant of the dielectric material. The sensitivity to oxidation is thought to be due to the reactivity of the C—H bonds of the methyl group bonded to silicon. The removal of the methyl group results in a more hydrophilic surface that may be responsible for a so-called "via poisoning" which is observed after via etch and photoresist strip with oxygen-containing plasma, and is related to suppression of the surface nucleation in subsequent via liner deposition steps.

More recently, Sugahara et al., in an article entitled "Chemical Vapor Deposition of $CF_3$-Incorporated Silica Films for Interlayer Dielectric Applications", published in the 1999 Joint International Meeting, Electrochemical Society Meeting Abstracts, volume 99-2, Abstract 746, 1999, described the reaction of trimethyl-fluoromethyl-silane ($CF_3Si(CH_3)_3$) with an ozone oxidizer at an elevated temperature. Sugahara et al. stated that the low reactivity of Si-alkyl bonds required the deposition to be carried at elevated temperatures (~350° C.). The material demonstrated resistance to oxidation by oxygen plasma. However, it is known that dielectric films produced by high temperature ozone processes are characterized by poor gap-fill, while continuous shrinkage in feature size of integrated circuit structure demands an increased gap-fill capability. Further, the presence of C—H bonds in the compound used by Sugahara may yield oxidation-sensitive dielectric materials due to the presence of C—H bonds in the precursor silane compound.

It would, therefore, be desirable to provide a low k silicon oxide dielectric material which exhibits properties of better resistance to oxidation during deposition and subsequent processing steps. It would also be desirable to provide, in at least one embodiment, a low k silicon oxide dielectric material which exhibits the gap-fill properties and film adherence properties of CVD-formed low k carbon doped silicon oxide dielectric materials such as discussed by the Dobson et al., Peters, and McClatchie et al. articles discussed above, while also maintaining a low formation temperature to conserve the thermal budget of the integrated circuit structure. This invention provides these characteristics and provides additional advantages as well.

SUMMARY OF THE INVENTION

The invention provides a process for forming a low k fluorine and carbon-containing silicon oxide dielectric material by reacting with an oxidizing agent one or more silanes including one or more organofluoro silanes characterized by the absence of aliphatic C—H bonds. In one embodiment of the invention, the oxidizing agent is a mild oxidizing agent.

The invention further provides a low dielectric constant fluorine and carbon-containing silicon oxide dielectric material for use in an integrated circuit structure containing silicon atoms bonded to oxygen atoms, silicon atoms bonded to carbon atoms, and carbon atoms bonded to fluorine atoms, where the dielectric material is characterized by the absence of aliphatic C—H bonds and where the dielectric material has a ratio of carbon atoms to silicon atoms of C:Si greater than about 1:3.

BRIEF DESCRIPTION OF THE DRAWINGS

The sole drawing is a flowsheet illustrating one embodiment of the process of the invention.

DETAILED DESCRIPTION OF THE INVENTION

The invention provides a process for forming a low dielectric constant (k) fluorine and carbon-containing silicon oxide dielectric material which includes reacting with an oxidizing agent one or more silanes including one or more organofluoro silanes characterized by the absence of aliphatic C—H bonds.

The low k fluorine and carbon-containing silicon oxide dielectric material formed in the method of the invention will have a resultant low dielectric constant relative to silicon oxide or silicon nitride dielectric materials, and will have an increased resistance to oxidation relative to organo-containing silicon oxide dielectric materials, which contain oxidant-sensitive aliphatic C—H bonds.

As used herein, an "organofluoro silane" is a compound that contains at least one silicon atom bonded to at least one carbon atom, at least one carbon atom bonded to at least one fluorine atom, and, optionally, one or more silicon atoms bonded to at least one hydrogen atom.

Use herein of the term "silanes" refers to silicon-containing compounds containing at least one silicon atom bonded to at least one hydrogen atom or bonded to at least one carbon atom. Exemplary silanes include $SiH_4$, $SiH_3(CH_3)$, and $SiH_3(CF_3)$.

The term "aliphatic C—H bond" refers to a C—H bond where the carbon atom bonded to the hydrogen atom is not in an aromatic ring; thus, "aliphatic C—H bond", as used herein, includes alicyclic C—H bonds. Similarly, an "aliphatic hydrogen" is a hydrogen atom bound to a carbon through an aliphatic C—H bond.

By use of the interchangeable terms "low k" or "low dielectric constant" herein is meant a dielectric constant below the dielectric constant of silicon oxide or silicon nitride. Preferably, a low dielectric constant is a dielectric constant below about 3.5, and more preferably below about 3.

The term "oxidizing agent" refers to an oxygen-containing compound capable of reacting with an organofluoro silane to form one or more Si—O bonds. Exemplary oxidizing agents include hydrogen peroxide, ozone ($O_3$), oxygen ($O_2$), oxides of nitrogen ($N_2O$, $NO$, $NO_2$), and mixtures thereof.

By use of the term "mild oxidizing agent" is meant an oxidizing agent, such as a peroxide, capable of oxidizing an organofluoro silane reactant at a low temperature, and which will not oxidize sufficiently vigorously to cause the Si—C bonds to break in preference to Si—H bonds, since cleavage of Si—C bonds can interfere with the film-forming capabilities of the reaction product. Typically, a mild oxidizing agent will cause cleavage of Si—H bonds in preference to Si—C bonds. An exemplary mild oxidation agent is hydrogen peroxide.

The term "strong oxidizing agent" means an oxidizing agent capable of forming Si—O bonds more readily than hydrogen peroxide. Exemplary strong oxidizing agents include ozone ($O_3$), oxygen ($O_2$), oxides of nitrogen ($N_2O$, $NO$, $NO_2$), and mixtures thereof.

The term "silicon-bonded moiety" as used herein refers to an atom or group of atoms, containing at least one atom bonded to a silicon atom.

By use of the term "low temperature" is meant a temperature not exceeding about 25° C., preferably not exceeding about 10° C., and most preferably not exceeding about 5° C. Typically, this temperature will be measured by reference to the temperature of the substrate support. 'Organofluoro Silane In one embodiment of the invention, at least one silicon atom of the organofluoro silane is bonded to at least one hydrogen atom. Reacting such an organofluoro silane with an oxidizing agent causes cleavage of Si—H bonds and formation of one Si—O bond for each Si—H bond cleaved. Other moieties that can be bonded to each silicon atom include: oxygen atoms bonded to either another silicon atom or a carbon atom; or organofluoro moieties containing carbon atoms bonded to fluorine atoms but not containing aliphatic C—H bonds; or both. By not containing aliphatic C—H bonds, the fluorine and carbon-containing moiety is less susceptible to oxidation by the oxidizing agent when the organofluoro silane is reacted with the oxidizing agent. An organofluoro silane characterized by the lack of aliphatic C—H bonds will preferably contain at least one hydrogen atom bound to a silicon atom and at least one carbon atom bound to a silicon atom. Exemplary organofluoro silanes which may be used in the method of the invention include $(H)_3Si(CF_3)$, $(H)_3Si(CF_2CF_3)$, $(H)_3Si(CF(CF_3)_2)$, $(H)_3Si(C(CF_3)_3)$, $(H)_3Si(CF_2)Si(H)_3$, $(H)_3Si(CF_2)Si(CF_3)(H)_2$, $(H)_2(CF_3)Si(CF_2)Si(CF_3)(H)_2$, $((CF_3)(H)SiO)_4$, and $((CF)_3(H)Si(CF_2))_4$.

At least one silicon-bonded moiety will contain at least one carbon atom bound to one or more fluorine atoms. Typically, this carbon and fluorine-containing moiety will be a saturated fluorocarbon containing only carbon atoms and fluorine atoms and having the general formula $C_xF_{2x+1}$, where x ranges from 1 to 5; for example, —$CF_3$, —$CF_2CF_3$, —$CF(CF_3)_2$, —$CF_2CF_2CF_3$, —$CF_2CF_2CF_2CF_3$, —$CF_2CF(CF_3)_2$, and —$C(CF)_3$, and the like. While x can range from 1 to 5, x preferably ranges from 1 to 4, more preferably ranges from 1 to 3, most preferably ranges from 1 to 2, and typically is 1. An organofluoro silane having such a silicon-bonded organofluoro moiety will typically also contain a hydrogen atom bonded to a silicon atom. In one embodiment, an organofluoro silane will contain only: one or more silicon atoms; one or more carbon atoms; one or more fluorine atoms; one or more hydrogen atoms, where the hydrogen atoms are bonded only to silicon atoms; and, optionally, one or more oxygen atoms.

An example of a family of such compounds has the general formula for single-silicon atom-containing compounds: $(H)_ySi(C_xF_{2x+1})_{4-y}$, where y is 1 to 3 and x is 1 to 5. An example of a family of multiple-silicon atom-containing organofluoro silanes has the formula: $R_1((R_2)Si(L))_nSi(R_3)$ where $R_1$=(H) or $(C_xF_{2x+1})$, $R_2$=$(H)_2$ or $(C_xF_{2x+1})(H)$, $R_3$=$(H)_3$ or $(C_xF_{2x+1})(H)_2$, L=—(O)— or —(C(R_4)_2)_m—, n=0 to 5, x=1 to 5, m=1 to 4, and each $R_4$ is independently F or $(C_xF_{2x+1})$. While n can range from 1 to 6, n preferably ranges from 1 to 4, more preferably ranges from 1 to 3, most preferably ranges from 1 to 2, and typically is 1. Also, m can range from 1 to 4, and preferably ranges from 1 to 3, more preferably ranges from 1 to 2, and typically is 1. An example of a family of cyclic organofluoro silanes has the formula: $((C_xF_{2x+1})_pSi(H)_{2-p}(L))_q$ where L=—(O)— or —$(C(R)_2)_r$—, each R is independently F or $(C_xF_{2x+1})$, p=1 to 2, q=3 to 6, r=1 to 4, and x=1 to 5. While q can range from 3 to 6, q preferably ranges from 4 to 5, and typically is 4. As with m above, r can range from 1 to 4, and preferably ranges from 1 to 3, more preferably ranges from 1 to 2, and typically is 1.

Alternatively, a carbon and fluorine-containing silicon-bonded moiety can contain one or more aromatic rings, so long as it also contains at least one carbon atom bonded to a fluorine atom. In one such case, the carbon atom bonded to the fluorine atom is an aliphatic carbon. For example, carbon-containing moieties having one or more aromatic rings can include —Ph—$CF_3$, —$CF_2$—Ph, —$CF_2$—Ph—$CF_3$, and the like, where Ph is a six carbon aromatic ring. Since aromatic C—H bonds are more resistant to oxidation relative to aliphatic C—H bonds, the aromatic C—H bond will not be readily oxidized by the oxidizing agent used in the method of the invention. Similarly, an organofluoro silane may contain an aromatic moiety bound to silicon, which aromatic moiety does not contain fluorine atoms, so long as the aromatic moiety contains no aliphatic hydrogens, and at least one other silicon-bonded moiety of the organofluoro silane contains at least one carbon atom bonded to at least one fluorine atom.

Moieties Linking Si Atoms

An organofluoro silane used in the method of the invention contains at least one silicon atom, but can contain up to 6 silicon atoms. Organofluoro silanes containing more than one silicon atom, including cyclic organofluoro silanes, will have either an oxygen atom or a —$(C(R)_2)_r$— moiety (where each R is independently F or $(C_xF_{2x+1})$; r=1 to 4; and x=1 to 5) linking the two or more silicon atoms. It is within the scope of the invention that an organofluoro silane containing three or more silicon atoms may have an oxygen atom linking a first set of two silicon atoms and a —$(C(R)_2)_r$— moiety linking a second set of two silicon atoms; however, an organofluoro silane will typically contain only oxygen atoms linking silicon atoms or only —$(C(R)_2)_r$— moieties linking silicon atoms. Preferably, —$(C(R)_2)_r$— is $CF_2$.

In one embodiment, it is desirable that some carbon atoms be incorporated into the backbone of the polymer to enhance the thermal conductivity of the resultant dielectric film. Thus a silicon oxide containing carbon and fluorine atoms and may have the structure:

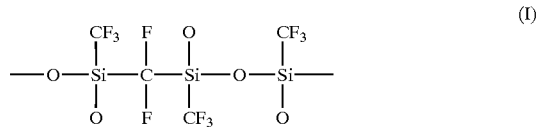

(I)

where one or more carbon atoms are incorporated into the silicon/oxygen chain. Such materials can be formed, for example, using organofluoro silanes having a —$CF_2$— linking two silicon atoms. For example, the organofluoro silane used to form the material of structure I can be $H_2CF_3SiCF_2SiCF_3H_2$.

Oxidizing Agent

The oxidizing agent used in the method of the invention can be any oxygen-containing compound capable of reacting with an organofluoro silane to form a Si—O bond. Typically, the oxidizing agent will be capable of reacting with a Si—H bond in forming the Si—O bond. Exemplary oxidizing agents capable of such a reaction include hydrogen peroxide, oxygen, ozone, and oxides of nitrogen ($N_2O$, NO, $NO_2$). Preferably, the oxidizing agent selectively cleaves Si—H bonds in preference over cleaving Si—C bonds, Si—O bonds, or C—F bonds. In one embodiment, the oxidizing agent also selectively cleaves Si—H bonds in preference over cleaving aromatic C—H bonds.

In another embodiment, an oxidizing agent for use in the method of the invention is a mild oxidizing agent, for example, hydrogen peroxide. A mild oxidizing agent reactant preferably comprises a vaporous source of peroxide. Such a peroxide can be conveniently obtained by flash evaporation of concentrated (30 vol. % or more) liquid hydrogen peroxide. By the term "source of peroxide" is meant any material capable of being heated (such as liquid hydrogen peroxide), or decomposed and heated (such as calcium peroxide or barium peroxide), to provide a vaporous hydrogen peroxide ($H_2O_2$) oxidizing agent.

In yet another embodiment, the oxidizing agent is more reactive than hydrogen peroxide, for example, ozone.

Reaction Conditions

The organofluoro silane and the oxidizing agent can be reacted together by introducing them into a reaction chamber and carrying out chemical vapor deposition. For example, an organofluoro silane and hydrogen peroxide are introduced into a reaction chamber containing a cooled substrate support therein on which is mounted a semiconductor substrate such as a silicon substrate on which the reaction product will deposit. For such a reaction, the reaction chamber is advantageously maintained at a pressure of from about 0.1 Torr to about 50 Torr, preferably from about 1 Torr to about 10 Torr, and most preferably from about 1 Torr to about 5 Torr. Both the organofluoro silane and the hydrogen peroxide are introduced into the chamber in a gaseous or vaporous phase. The delivery system for the reactants is preferably maintained at a temperature which ensures delivery of the reactants into the chamber as gases or vapors, typically from about 70° C. to about 100° C. Flow rates of the individual reactants will depend upon chamber size and will also vary with the particular reactants. During the reaction and deposition, the temperature of the substrate support in the reaction chamber is maintained at a low temperature not exceeding about 25° C., preferably not exceeding about 10° C., and most preferably not exceeding about 5° C. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm or more. Thicker layers can be formed, but are deemed unnecessary and merely add to the bulk of the structure. Such a reaction method forms a low k film having excellent via-filling properties, yields a dielectric layer with low adhesion stress, and can be preferable when using silane compounds that, under particular conditions, can be oxidized by mild oxidizing agents such as peroxide.

In another embodiment, the organofluoro silane and oxidizing agent reactants can be reacted together by introducing gaseous or vaporous organofluoro silane or an organofluoro silane-containing mixture and a strong oxidizing agent into a chamber at about 40 Torr to about 1000 Torr, preferably from about 700 Torr to about 800 Torr. The reaction can then be carried out at a temperature from about 250° C. to about 450° C., preferably from about 250° C. to about 400° C., and typically about 350° C. The strong oxidizing reagent used in the reaction can be any oxygen-containing oxidizing reagent capable of reacting with an organofluoro silane to form a low k fluorine and carbon-containing silicon oxide dielectric material, such as ozone ($O_3$), oxygen ($O_2$), oxides of nitrogen ($N_2O$, $NO$, $NO_2$), and the like. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm or more.

In yet another embodiment, a plasma-enhanced chemical vapor deposition (PECVD) can be carried out. A plasma-activated strong oxidizing agent and a gaseous or vaporous organofluoro silane or an organofluoro silane-containing mixture and a carrier gas such as helium can be introduced into a chamber at about 1 Torr to about 40 Torr, preferably from about 5 Torr to about 20 Torr. The reaction can then be carried out at a temperature from about 50° C. to about 450° C., preferably from about 200° C. to about 300° C., and typically about 250° C. The strong oxidizing reagent used in the reaction can be any oxygen-containing oxidizing reagent capable of reacting with an organofluoro silane to form a low k fluorine and carbon-containing silicon oxide dielectric material, such as ozone ($O_3$), oxygen ($O_2$), oxides of nitrogen ($N_2O$, $NO$, $NO_2$), and the like. Typically, the strong oxidizing agent will be oxygen. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm or more.

While not intending to be limited to the following theory, it is thought that, as the polymer forms, bonds of the organofluoro moieties to the silicon atoms of the silicon oxide polymer will not be oxidized as readily as bonds of unsubstituted alkyl moieties to the silicon atoms of the silicon oxide polymer. Furthermore, the dielectric constant of the resulting dielectric material having fluorocarbon groups substituted for alkyl groups should not be adversely affected by the higher polarizability of the fluorocarbon groups because of the higher volume of the fluorocarbon group over the alkyl group, since the dielectric constant is obtained by dividing the polarizability ($\alpha$) by the volume (v) in the formula $k=\alpha/v$ and increases in polarizability tend to be canceled out by increases in volume.

Silane Mixtures

While the product of the process of the invention principally comprises a low dielectric constant (low k) silicon oxide dielectric material containing organofluoro groups, it is within the scope of the invention to utilize, in the process of the invention, mixtures of the organofluoro silanes with non-fluoro silanes, including $SiH_4$. In one embodiment, it may be desirable to use as one component of the mixture an organofluoro silane containing aliphatic C—H bonds. Such materials can be blended with one or more of the above-described organofluoro silanes to enhance other physical properties of the resultant film of low k dielectric material. Exemplary physical properties include dielectric constant, adhesion capabilities, via filling capabilities, surface stress, and the like.

For example, to enhance the film forming properties of the low dielectric constant fluorine and carbon-containing silicon oxide dielectric material of the invention, one or more organofluoro silanes can be blended with one or more of the following non-fluoro silanes:

a) silanes having no silicon atoms bonded to carbon-containing groups;

b) organo silanes containing silicon atoms bonded to one or more carbon-containing groups having aliphatic C—H bonds (such as methyl silane used in the Trikon Flowfill process);

c) organo silanes that do not contain aliphatic C—H bonds, such as organo silanes containing a silicon atom bonded to an aromatic carbon group; and d) mixtures of any two or more of a), b), and c).

Such a mixture of silanes which includes one or more organofluoro silanes may be reacted, for example, with hydrogen peroxide ($H_2O_2$) in forming a low k fluorine and carbon-containing silicon oxide dielectric material. For example, a mixture of silanes corresponding to mixture a) above could contain a mixture of silane ($SiH_4$) and an organofluoro silane having the formula $(H)_y Si(C_x F_{2x+1})_{4-y}$, where y ranges from 1 to 3, x is an integer from 1 to 5 A mixture of silanes corresponding to mixture b) could contain methyl silane combined with the organofluoro silane $(H)_y Si(C_x F_{2x+1})_{4-y}$. To form a mixture including both a) and b), one could use both silane and methyl silane in combination with the organofluoro silane having the formula $(H)_y Si(C_x F_{2x+1})_{4-y}$. Other examples of substituted silanes which can be used either singly or in combination to form mixtures of silanes containing organofluoro silanes include dimethyl silane, ethyl silane, isopropyl (1-methylethyl) silane, n-butyl silane, isobutyl (2-methyl propyl) silane, phenyl silane, and methylenebis-silane.

As stated above, the amount of such silanes which may be combined with one or more organofluoro silanes in the method of the invention will typically be combined as minor components. By use of the term "minor component" is meant that the one or more non-fluorosilanes used in a mixture of silanes will comprise less than 50 volume % of the total volume of the compounds in the mixture, ensuring that the major component of the mixture comprises one or more organofluoro silanes. However, it is recognized that in some instances the enhancement of other properties of the resulting mixture, e.g., the film forming properties, may justify the use of more that 50 volume % of other silanes, that is, up to about 70 volume % of other silanes and 30 volume % of one or more organofluoro silanes, even though such usage may raise the dielectric constant of the resulting dielectric material.

When using such mixtures the average dielectric constant of the dielectric material formed using a mixture of silanes can be determined for the particular proportions of such dielectric materials using the formula:

$$k_{av} = \Sigma_i x_i k_i$$

where $x_i$ is the volume fraction of dielectric component i and $k_i$ is the dielectric constant of the pure dielectric component. Thus, for example, dielectric materials (a) and (b) might be added to the low dielectric constant fluorine and carbon-containing silicon oxide dielectric material of the invention to enhance the film forming properties of the resulting mixture. If a mixture is formed comprising 10 volume % of dielectric material (a), 15 volume % of dielectric material (b), and 75 volume % of the low dielectric constant fluorine and carbon-containing silicon oxide dielectric material, the average dielectric constant of the mixture will comprise the sum of the products of the dielectric constant of each of the materials times its volume % in the mixture. If the dielectric constant of the low dielectric constant fluorine and carbon-containing silicon oxide dielectric material is 2.4, the dielectric constant of dielectric material (a) is 3.5, and the dielectric constant of dielectric material (b) is 3.4, the average dielectric constant $k_{av}$ would equal (2.4×0.75)+(3.5×0.10)+(3.4×0.15)=2.7.

In Combination with Other Layers

While the low k fluorine and carbon-containing silicon oxide dielectric material formed in the method of the invention will have increased oxidation resistance relative to carbon-doped silicon oxide dielectric material, it may be desirable to form a thin conventional (standard k) silicon oxide ($SiO_2$) or silicon nitride base layer over the substrate to act as a moisture barrier layer for such low k fluorine and carbon-containing silicon oxide dielectric material subsequently formed thereon. A similar moisture barrier layer may also be formed over such a low k fluorine and carbon-containing silicon oxide dielectric layer for the same reasons. Such a barrier layer adjacent the layer of low k fluorine and carbon-containing silicon oxide dielectric material can be formed to a thickness of about 50 nanometers (nm) to provide adequate protection (if deemed necessary) for the low k fluorine and carbon-containing silicon oxide dielectric layer to be formed thereon. Thicknesses exceeding this minimum may be used, but are probably unnecessary and may negatively contribute to an undesired rise in the overall dielectric constant of the resulting composite layer. Such barrier layers may then serve to protect the low k dielectric material during subsequent processing steps.

Similarly, the low k fluorine and carbon-containing silicon oxide dielectric material formed in the method of the invention may find utility, for example, as one or more of the low k dielectric layers described in Ser. Nos. 09/426,061; 09/605,380; 09/704,200; and U.S. Pat. Nos. 6,423,628; 6,232,658; 6,391,795; 6,350,700; 6,423,630; all assigned to the assignee of this invention.

Product—Dielectric Material

The low dielectric constant fluorine and carbon-containing silicon oxide dielectric material produced by the method of the invention will be suitable for use in integrated circuit structures. This fluorine and carbon-containing silicon oxide dielectric material will contain silicon atoms bonded to oxygen atoms, silicon atoms bonded to carbon atoms, and carbon atoms bonded to fluorine atoms. In one embodiment of the invention, the fluorine and carbon-containing silicon oxide dielectric material will be characterized by the absence of aliphatic C—H bonds. A fluorine and carbon-containing silicon oxide dielectric material produced by the method of the invention will have a dielectric constant below the dielectric constant of silicon oxide or silicon nitride. Preferably, the dielectric constant of the fluorine and carbon-containing silicon oxide dielectric material will be below about 3.5, more preferably below about 3.

Additionally, the fluorine and carbon-containing silicon oxide dielectric material will demonstrate superior resistance to degradation in subsequent processing steps such as, for example, via etch and photoresist removal steps. While not wishing to be limited by a particular theory, it is considered that organofluoro compounds, particularly those that do not contain aliphatic C—H bonds, will have an increased resistance to oxidation. This resistance will decrease the susceptibility of the fluorine and carbon-containing silicon oxide dielectric material to physical degradation which can occur in a variety of manners, such as thermal instability, solvent absorption, and the like.

In one embodiment, the fluorine and carbon-containing silicon oxide dielectric material will contain as principal components only silicon atoms, carbon atoms, fluorine atoms, and oxygen atoms. Such a fluorine and carbon-containing silicon oxide dielectric material will not contain a significant number of hydrogen atoms, and, consequently, will not contain a significant number of bonds susceptible to oxidation during deposition or subsequent processing steps.

In another embodiment, the fluorine and carbon-containing silicon oxide dielectric material will have a ratio of carbon atoms to silicon atoms of C:Si greater than about 1:3. As described above, the introduction of carbon atoms into a dielectric material has been useful for lowering the dielectric constant of silicon oxide dielectric materials. By introducing a greater ratio of carbon atoms to silicon atoms, the dielectric constant can be lowered even further. A particular choice of C:Si ratio will depend not only upon the desired dielectric constant, but also upon other desired physical properties of the dielectric material. Thus, a desired C:Si ratio can be greater than about 2:3, greater than about 1:1 or greater than about 3:2.

Similarly, because several components can be combined in a silane mixture used to form the fluorine and carbon-containing silicon oxide dielectric material, some silicon atoms may not be bonded to any carbon atoms, while some carbon atoms may be bonded solely to other carbon atoms and other fluorine atoms. For example, a silane mixture can contain SiH$_4$ and H$_3$Si(CF$_2$CF$_3$); in this example, the ratio of C:Si will be a function of the ratio of H$_3$Si(CF$_2$CF$_3$):SiH$_4$ in the silane mixture. Such a ratio will typically be greater than about 1:3, greater than about 2:3, greater than about 1:1, or greater than about 3:2. Regardless, such a dielectric material will be characterized by the presence of C—C bonds.

Thus, the invention provides a low temperature process for forming a low k fluorine and carbon-containing silicon oxide dielectric material exhibiting superior resistance to oxidation than conventional carbon-doped low k silicon oxide dielectric materials while also providing good gap-filling capabilities and low stress adhesion not always found in other fluorine and carbon-containing silicon oxide dielectric materials.

The following example serves to further illustrate the process of the invention.

EXAMPLE

Trifluoromethyl silane (CF$_3$SiH$_3$) and hydrogen peroxide can be introduced into a reaction chamber containing a cooled substrate support therein on which is mounted a silicon substrate on which the reaction product will deposit. The reaction chamber is advantageously maintained at a pressure of about 1–5 Torr. Both the trifluoromethyl silane and the hydrogen peroxide are introduced into the chamber in a gaseous or vaporous phase. The delivery system for the reactants is maintained at about 100° C., which ensures delivery of the reactants into the chamber as gases or vapors. Flow rates of the individual reactants will depend upon chamber size and will also vary with the particular reactants. During the reaction and deposition, the temperature of the substrate support in the reaction chamber is maintained at a low temperature of about 0–10° C. The reaction and deposition is carried out for a period of time sufficient to form the layer of low k fluorine and carbon-containing silicon oxide dielectric material to the desired thickness over the integrated circuit structure already formed on the silicon substrate. Usually this thickness will be a minimum of about 300 nm to ensure sufficient electrical insulation between underlying conductive regions and conductive regions to be formed over the low k dielectric material. Such a reaction method forms a low k film having excellent via-filling properties, yields a dielectric layer with low adhesion stress.

While a specific embodiment of the process of the invention has been illustrated and described for carrying out the invention, modifications and changes of the apparatus, parameters, materials, etc. used in the process will become apparent to those skilled in the art, and it is intended to cover in the appended claims all such modifications and changes which come within the scope of the invention.

Having thus described the invention, what is claimed is:

1. A process for forming a low k fluorine and carbon-containing silicon oxide dielectric material comprising reacting with an oxidizing agent one or more silanes including one or more organo fluoro silanes.

2. The process of claim 1 wherein said oxidizing agent is a mild oxidizing agent.

3. The process of claim 2 wherein said mild oxidizing agent is hydrogen peroxide (H$_2$O$_2$).

4. The oxidizing agent of claim 1 wherein said oxidizing agent is more reactive than hydrogen peroxide.

5. The process of claim 1 wherein said oxidizing agent is selected from the group consisting of ozone (O$_3$), oxygen (O$_2$), oxides of nitrogen (N$_2$O, NO, NO$_2$), and mixtures thereof.

6. The process of claim 1, wherein said one or more organofluoro silanes has the formula: (H)$_y$Si(C$_x$F$_{2x+1}$)$_{4-y}$, where y=1 to 3 and x=1 to 5.

7. The process of claim 1 herein said one or more organofluoro silanes has the formula: R$_1$((R$_2$)Si(L))$_n$Si(R$_3$) where R$_1$=(H) or (C$_x$F$_{2x+1}$), R$_2$=(H)$_2$ or (C$_x$F$_{2x+1}$)(H), R$_3$=(H)$_3$ or (C$_x$F$_{2x+1}$)(H)$_2$, L=—(O)— or —(C(R$_4$)$_2$)$_m$—, n=0 to 5, x=1 to 5, m=1 to 4, and each R$_4$ is independently F or (C$_x$F$_{2x+1}$).

8. The process of claim 7 wherein n is at least 1.

9. The process of claim 8 wherein said one or more organofluoro silanes has the formula: (R$_4$)Si(CF$_2$)Si(R$_5$) where R$_5$=(H)$_3$ or (CF$_3$)(H)$_2$.

10. The process of claim 1 wherein said one or more organofluoro silanes has the formula:

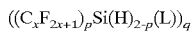

where L=—(O)— or —(C(R)$_2$)$_r$—;
each R is independently F or (C$_x$F$_{2x+1}$), p=1 to 2, q=3 to 6, r=1 to 4, and x=1 to 5.

11. The process of claim 1 wherein said one or more organofluoro silanes are characterized by the presence of Si—H bonds.

12. The process of claim 1 wherein said one or more silanes further include SiH$_4$.

13. The process of claim 1 wherein said one or more organofluoro silanes include CF$_3$SiH$_3$.

14. The process of claim 1 wherein said reacting is carried out at low temperature.

15. A process for forming a low k fluorine and carbon-containing silicon oxide dielectric material comprising reacting with a mild oxidizing agent one or more silanes including one or more organofluoro silanes characterized by the absence of aliphatic C—H bonds.

16. The process of claim 15 wherein said one or more silanes consist essentially of one or more organofluoro silanes.

17. The process of claim 15 wherein said mild oxidizing agent is hydrogen peroxide.

18. The process of claim 15 wherein said one or more organofluoro silanes include trifluorosilane (CF$_3$SiH$_3$).

19. The process of claim 15 wherein said reacting is carried out at low temperature.

20. A process for forming a low k fluorine and carbon-containing silicon oxide dielectric material which comprises reacting, with an oxidizing agent, one or more organo fluoro silanes blended with one or more of the following non-fluoro silanes:

a) silanes having no silicon atoms bonded to carbon-containing groups;

b) organo silanes containing silicon atoms bonded to one or more carbon-containing groups having aliphatic C—H bonds;

c) organo silanes that do not contain aliphatic C—H bonds; and d) mixtures of any two or more of a), b), and c).

21. The process of claim 20 wherein said oxidizing agent comprises hydrogen peroxide.

* * * * *